United States Patent [19]
von Basse

[11] 4,136,401
[45] Jan. 23, 1979

[54] STORAGE MODULE

[75] Inventor: Paul-Werner von Basse, Wolfratshausen-Farchet, Germany

[73] Assignee: Siemens Aktiengesellschaft, Berlin & Munich, Fed. Rep. of Germany

[21] Appl. No.: 745,239

[22] Filed: Nov. 26, 1976

[30] Foreign Application Priority Data
Nov. 27, 1975 [DE] Fed. Rep. of Germany ....... 2553344

[51] Int. Cl.² .................................................. G11C 11/40
[52] U.S. Cl. .................................... 365/208; 307/238; 365/186; 365/210
[58] Field of Search ..... 340/173 R, 173 DR, 173 FF; 365/207, 186, 208

[56] References Cited
U.S. PATENT DOCUMENTS
3,983,544 9/1976 Dennison et al. ................ 340/173 R Primary Examiner—Terrell W. Fears
Attorney, Agent, or Firm—Hill, Gross, Simpson, Van Santen, Steadman, Chiara & Simpson

[57] ABSTRACT

A storage module includes single-transistor storage cells which are arranged between work lines and bit lines and form a cell field. The cell field is divided into two zones in that the bit lines are divided into two halves. A read out amplifier is arranged, in each case, between the two halves of each bit line, and at least one blank cell is arranged in each zone of the cell field in respect of each half of the bit line. The blank cells are designed to be identical to the storage cells and are selected during the operating interval of the storage cells of the cell field so that the storage capacitances of the blank cells are charged to the potential of the bit lines. At the time of selection of a word line of a zone of the cell field, the blank cells arranged in this zone are switched off.

2 Claims, 4 Drawing Figures

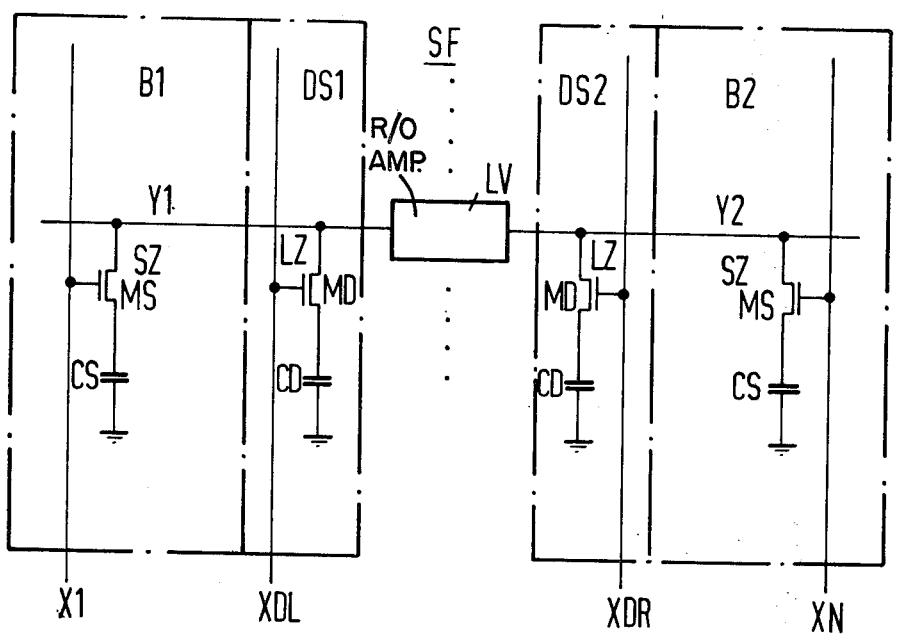
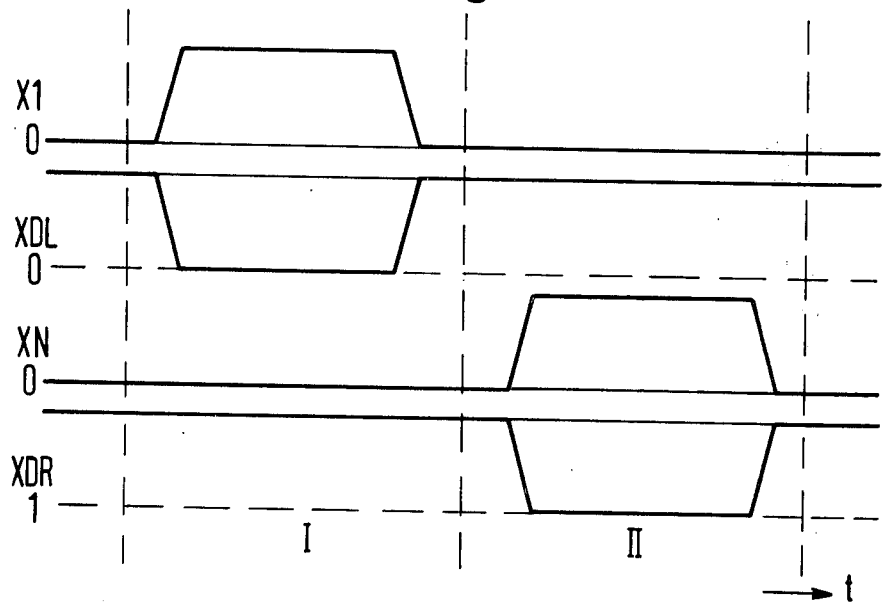

STORAGE MODULE

BACKGROUND OF THE INVENTION

1. Field of the Invention

This invention relates to a storage module in which a cell field is formed of single-transistor storage cells which are arranged between word lines and bit lines, in which the cell field is divided into two zones in that the bit lines are divided into two halves, in which a read out amplifier is arranged, in each case, between the two halves of each bit line and at least one blank cell is arranged in each zone of the cell field in respect of each half of the bit line.

2. Description of the Prior Art

Storage modules are well known in the art in which storage cells having transistors are arranged between word lines and bit lines. As an example of such an arrangement, one may refer to the publication "Electronics", Sept. 13, 1973, Pages 116 to 121. In these cell fields, a storage cell is in each case arranged at the intersections of word lines and bit lines. A storage cell can consist, for example, of a MOS transistor and a storage capacitor. Here, the controlled electrode of the transistor is connected to a word line, whereas an electrode of the controlled path of the transistor is connected to a bit line, and the other electrode is connected to the storage capacitor.

FIG. 1 illustrates the construction of a known storage field. Here, only one bit line and a plurality of word lines have been illustrated for the storage field. The word lines are referenced X and the bit line is referenced Y. A storage cell SZ is in each case located at the intersections of the word lines X and the bit lines Y. This storage cell consists of a MOS transistor MS and a storage capacitor CS. The entire storage cell field is divided into two zones B1 and B2. The division is made in that each bit line Y is in each case divided into two halves Y1 and Y2, a read out amplifier LV being arranged between these two halves of the bit line. Therefore, a read out amplifier column is situated between the two cell field zones B1 and B2. The read out amplifiers can be constructed, for example, as pulsed flip-flops as described in the above-mentioned publication.

If the storage cells SZ consist of single-transistor storage cells, the read out signals which arise on the read out of a storage cell are very small. If the storage cells connected to a word line are selected, and thus the control inputs of the transistors MS which are connected to the word line are supplied with a signal which renders these transistors conductive, then as a result of the capacitive coupling between the word lines and the bit lines, interference signals are coupled over to the bit lines. These interference signals are superimposed upon the read out signals, so that often it is impossible to analyze the read out signals. For this reason, blank cells are provided, with the aid of which the interference signals which are coupled to the bit lines through the selection of the word line are to be compensated. Here, such a blank cell LZ is provided on each side of the read out amplifier LV in each half of the bit line. This cell consists, like the storage cell SZ, in each case of a transistor MD and a storage capacitor CD. The connection between the transistor MD and the storage capacitor CD is also connected to a generator G.

With the aid of the blank cell LZ which forms a blank cell column DS, the interferences which are coupled to the bit lines due to the selection of the word lines are now compensated. The operation is as follows: Prior to the call-up of a word line of the cell field, the capacitors CD of the blank cells are charged by the generator G to a voltage which lies between the zero signal level and the one signal level of the storage cells. On the call up of a word line, the blank cells arranged in the other cell zone are also called up. If, for example, the word line X1 is operated, the blank cells LZ located in the cell zone are then likewise operated by a signal on the line XDR. This is illustrated in FIG. 2. As a result of the selection of the word line X1, interferences arise on the bit line half Y1 and as a result of the selection of the line XDR of the blank column DS, interferences occur on the bit line half Y2. These interferences are fed to the read out amplifier LV and can thus be compensated. Naturally, corresponding things apply when the word line XN is operated. Then, at the same time, the line XDL of the blank cell column DS1 is selected.

The known arrangement illustrated in FIG. 1 has the disadvantage that an additional generator G is required in order to produce the mean voltage across the storage capacitors CD of the blank cells. This generator must be able to compensate component fluctuations, temperature fluctuations and supply voltage fluctuations. In addition, the interferences caused by the word lines act as a push-push interference on the read-out amplifiers, whose operating point is thus displaced.

SUMMARY OF THE INVENTION

The object of the present invention is to improve upon the storage modules of the prior art, such as that illustrated in FIG. 1, in such a manner that no additional generator is required, and as a result of the compensation of the interferences on the bit lines, no push-push interference of the read-out amplifiers occurs.

This object is achieved by providing blank cells which are designed to be identical to the storage cells and causing selection of the blank cells during the operating interval of the storage cells of the cell field so that the storage capacitances of the blank cells are charged to the potential of the bit lines and that on selection of a word line of a storage zone of the cell field at the same time the blank cells arranged in this zone are switched off.

The blank cells are thus designed to be identical to the storage cells. As just mentioned, in those intervals in which the storage cells are not operated, all the blank cells are continuously selected, so that the capacitors of the blank cells can become charged to the potential of the bit lines. Therefore, an additional generator is no longer necessary.

In the selection of a word line, the blank cells of the same zone of the cell field are switched off, whereas the blank cells of the other zone of the cell field remains switched on. The interferences produced as a result of the switching-on of the storage cells via the word line are counteracted in the same manner as the interferences coupled to the bit lines by switching-off of blank cells. Thus, they are able to compensate these interferences.

The operative point of the read out amplifiers is therefore not displaced, so that the items of information of the storage cells can be accurately evaluated. In this manner it is possible for the read out signals on the bit lines to be reduced, i.e. smaller storage capacitors can be used for the storage cell field. However, this means a reduction in the requisite chip surface for a storage module.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a schematic illustration of the construction of a cell field according to the present invention; and FIG. 4 is a voltage diagram for the operation of the cell field illustrated in FIG. 3.

DESCRIPTION OF THE PREFERRED EMBODIMENT

Figure 1:
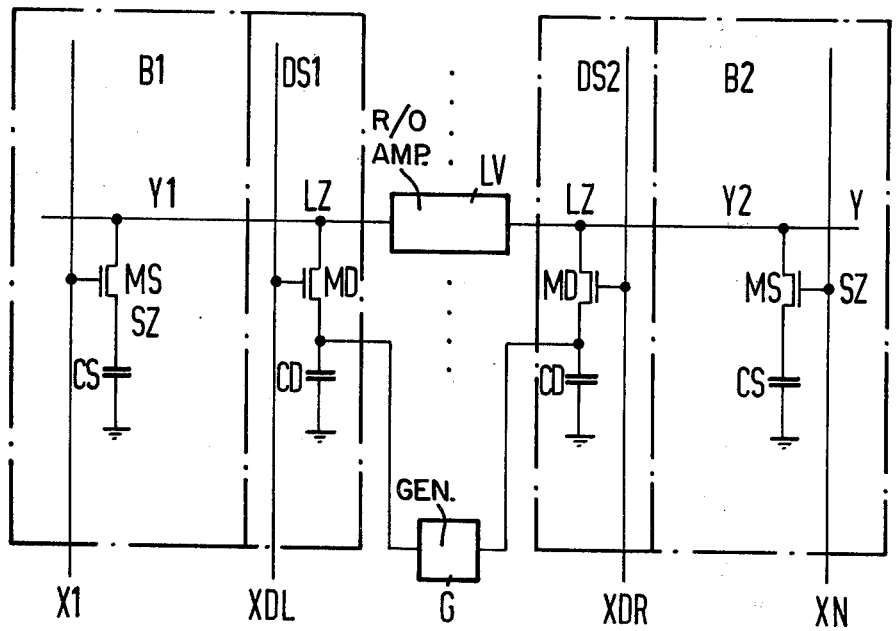
FIG. 1 is a schematic illustration of a prior art construction of a cell field of a storage module.
Figure 2:
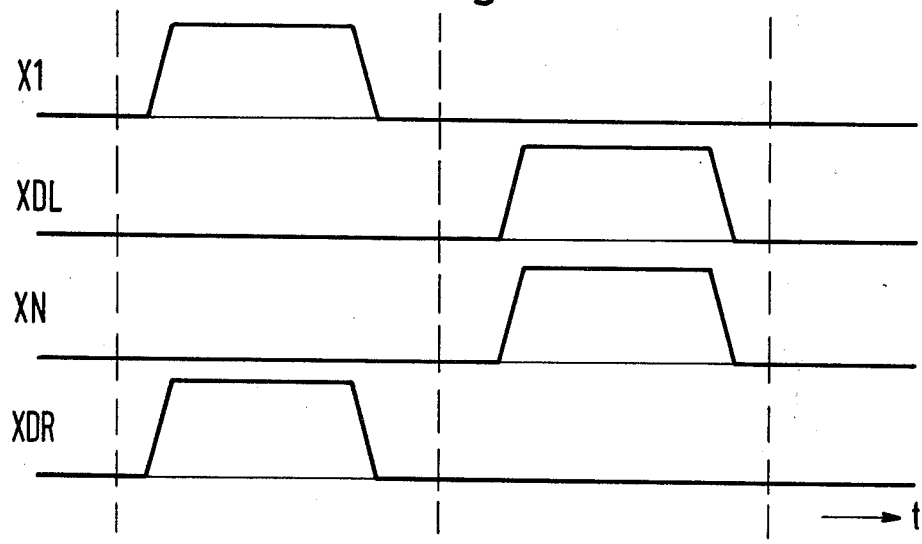
FIG. 2 is a voltage diagram corresponding to the operation of the apparatus illustrated in FIG. 1.

Inasmuch as the operation of the apparatus of FIG. 1 and the pulses relating thereto have been discussed above with respect to the prior art, further discussion thereof is not thought to be necessary at this time and the invention will be discussed with respect to FIGS. 3 and 4.

In FIG. 3, the storage field SF is divided into two zones B1 and B2. This is effected in that the bit lines Y are each divided into two halves, and in fact into the bit line half Y1 and the bit line half Y2. A read out amplifier LV is in each case arranged between the two halves of a bit line Y, so that a read out amplifier column is formed. A storage cell SZ is only provided between the intersections of word lines X and bit lines Y. In the exemplary embodiment illustrated in FIG. 3, the storage cell consists of a single-transistor cell composed of a MOS transistor MS and a storage capacitor CS. The storage cells SZ are connected in a known manner to the word line X and the bit line Y. A column having blank cells LZ is in each case arranged on both sides of the read out amplifiers LV. The blank cells likewise consist of a transistor MD and a storage capacitor CD. Here, the blank cells are of identical construction to the storage cells SZ. Therefore, a column DS1 of blank cells is formed on one side of the read out amplifiers LV and a column DS2 of blank cells is formed on the other side of the read out amplifiers LV. The blank cells of the one blank cell column DS1 are operated by the line XDL, and the blank cells of the other blank cell column DS2 are operated by the line XDR.

The construction of the read out amplifier LV can, for example, again be gathered from the above-mentioned publication. Other examples of the read out amplifier are described in the "Digest of Technical Papers, IEEE International Solid State Circuit Conference 1973". These publications are fully incorporated herein by this reference.

The function of the storage field in FIG. 3 will be described with reference to the voltage diagram of FIG. 4 in which voltages are plotted with respect to time t. If the storage cells SZ are not operated, and thus the transistors MS of the storage cells SZ are blocked, the transistors of the blank cells MD are driven conductive, so that the storage capacitors CD of the blank cells LZ can charge to the potential of the bit lines Y. Therefore, for example, the lines XDL and XDR carry high potential, whereas the word lines X1 and XN carry low potential.

If, now, for example, the word line X1 of the cell field zone B1 is operated to read out items of information, then the transistors MS of the storage cells which are connected to this word line are brought into the conductive state. In this manner, the item of information (charge) contained in the storage capacitors CS of the storage cells can be fed to the bit line. However, as a result of the operation of the word line X1, simultaneously and due to capacitive coupling, interferences are transmitted to the bit line half Y1.

On the operation of the word line X1, simultaneously the line XDL of the blank cell column DS1 is switched off. See zone I in FIG. 4. As a result of the switching off of the high potential on the line XDL, the transistors MD of the blank cells are brought into the blocked state. As a result of the change in the potential on the line XDL, however, again as a result of capacitive coupling, interferences are transmitted to the bit line half Y1, which interferences, however, are oppositely directed to the interferences which are transmitted from the word line X1 to the bit line half Y1. Therefore, the interferences can compensate one another on the bit line half Y1. The result is that the read out signal transmitted from the storage cells SZ to the bit line half Y1 is not influenced by these interferences and can be fed, undisturbed, to the read out amplifiers LV. During the read out process in the zone B1 of the storage cell field, no change is made in the conditions in the region B2 of the storage cell field. That is to say that the word line XN continues to carry low potential, whereas the line XDR of the blank cell column DS2 continues to carry high potential.

If, however, information is to be read from the zone B2 of the storage cell field, this is effected in the same manner as described for the storage zone B1. That is to say that the word line XN is operated, and thus the transistors MS of the storage cells SZ are brought into the conductive state, whereas the transistors MD of the blank cells of the blank cell column DS2 are switched off. The conditions in the zone B1 of the storage cell field again remain unaffected by the read-out process in the zone B2 of the storage field. These conditions are illustrated in the zone II of FIG. 4. Here again, the interferences produced on the bit line half Y2 as a result of the potential change on the word line XN are compensated by the interferences which are brought about on the bit line half Y2 as a result of the opposite potential change on the line XDR.

As the interferences are compensated on the same side of the read out amplifiers LV, the operative point of the read out amplifiers LV is not displaced. The result is that the items of information read out from the storage cells SZ can be accurately evaluated. There is also no necessity for an additional generator for precharging the blank cell.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a storage module of the type in which a plurality of single-transistor storage cells are arranged between word lines and bit lines to form a cell field, in which the cells comprise a single-transistor and a capacitance connected thereto, in which the cell field is divided into two zones in that the bit lines are divided into two halves, in which a read out amplifier is connected, in each case, between the two halves of each bit line, and at least one blank cell is arranged in each zone of the cell field in respect of each half of the bit line, the improvement therein:

said blank cells constructed identically to the storage cells;

means for selecting the blank cells during the operating interval of the storage cells of the cell field so that the storage capacitances of the blank cells are charged to the potential of the bit lines; and means for switching off the blank cells of a zone upon the selection of a word line of that zone to effect oppositely directed interferences to the respective bit line half to compensate each other.

2. A method of operating a storage module which has single-transistor storage cells which are arranged between word lines and bit lines to form a cell field, in which each storage cell comprises a single-transistor and a capacitance connected thereto, in which the cell field is divided into two zones in that the bit lines are divided into two halves, in which a read out amplifier is in each case arranged between the two halves of each bit line, and in which at least one blank cell is arranged in each zone of the cell field in respect of each half of the bit line, the improvement comprising the steps of:

selecting the blank cells during the operating interval of the storage cells of the cell field so that the storage capacitances of the blank cells are charged to the potential of the bit lines; and switching off the blank cells of a zone simultaneously with selecting a word line of the zone to cause oppositely directed interferences to be coupled to and compensate each other on the respective bit line half.

* * * * *